United States Patent [19]

O'Neill et al.

[11] Patent Number: 4,805,730

[45] Date of Patent: Feb. 21, 1989

[54] LOUDSPEAKER ENCLOSURE

[75] Inventors: Robert M. O'Neill; Jason K. Dunaway, both of Meridian, Miss.

[73] Assignee: Peavey Electronics Corporation, Meridian, Miss.

[21] Appl. No.: 142,018

[22] Filed: Jan. 11, 1988

[51] Int. Cl.[4] .............................................. H05K 5/00

[52] U.S. Cl. .................................. 181/148; 181/145; 181/153; 181/199; 312/111; 312/198

[58] Field of Search ............... 181/145, 148, 153, 199; 381/89, 90; 312/7.1, 7.2, 107, 108, 111, 198, 263, 264, 275; D14/33

[56] References Cited

U.S. PATENT DOCUMENTS

| | | | |
|---|---|---|---|
| D. 222,476 | 10/1971 | Ohyama | D14/33 |
| D. 270,444 | 9/1983 | Matsuda et al. | D14/33 |
| 3,851,936 | 12/1974 | Muller | 312/108 |
| 3,953,675 | 4/1976 | Babb | 181/148 X |
| 4,014,597 | 3/1977 | Griffin, Jr. | 312/7.1 |
| 4,129,008 | 12/1979 | LeTourneau | 181/148 X |

*Primary Examiner*—B. R. Fuller

*Attorney, Agent, or Firm*—Huff & Associates

[57] ABSTRACT

A loudspeaker enclosure which is adapted to be easily assembled with other like enclosures. The loudspeaker enclosure comprises a front wall through which sound can emanate, two essentially parallel end walls, each end wall being in the shape of a trapezoid and a back wall. The enclosure further includes two side walls extending between the end walls, each of the side walls having a plurality of outwardly projecting linear ribs extending on a line between the front wall and the back wall.

13 Claims, 2 Drawing Sheets

LOUDSPEAKER ENCLOSURE

The present invention relates generally to a loudspeaker enclosure and, more particularly, to a loudspeaker enclosure adapted to be suspended and capable of supporting other similar enclosures to form a ganged array of loudspeaker which project sound emanating therefrom in a plurality of directions.

BACKGROUND OF THE INVENTION

In the amplification of sound such as in the performance of music and the like, it is common practice, particularly in a large space or area such as a church or theater, to utilize a plurality of loudspeaker oriented in different directions. This is generally necessary since loudspeakers tend to project the amplified sound directionally and thus a number of loudspeakers are required to provide effective sound transmission to all areas.

In many instances, space limitations and/or effective sound transmission make it desirable to suspend the loudspeakers from an overhead supporting structure. While each loudspeaker can be suspended individually, the time and expense for such installation is high. Also, suitable support structures for all the loudspeakers may not be available. Furthermore, by suspending each loudspeaker individually, difficulties are encountered in easily readjusting the orientation of the loudspeakers to accommodate various conditions.

It is also may be desirable to group a particular number of loudspeakers in an array which is as compact as possible for, among other things, space considerations. Conventional loudspeakers having a rectangular box-type enclosure are not particularly suitable for assembling compact arrays or clusters of loudspeakers where the loudspeakers have different orientations.

SUMMARY OF THE INVENTION

It is therefore a feature of the subject invention to provide a loudspeaker enclosure which, when suspended, can readily support one or more other speaker enclosures of the same type in an array or cluster.

It is another feature of the present invention to provide a loudspeaker enclosure which can be assembled into an array of loudspeaker enclosures in which at least some of the enclosures can be easily adjusted as to orientation.

It is a further feature of the present invention to provide a loudspeaker enclosure of a shape which can be assembled into compact arrays or clusters of a plurality of enclosures where the enclosures have differing orientations.

Briefly, in its broader aspects, the present invention comprehends an enclosure adapted to contain sound generating means, the enclosure comprising a front wall through which sound can emanate, two essentially parallel end walls, each in the shape of a trapezoid, a back wall, and two side walls extending between the end walls, each of said side walls having a plurality of outwardly projecting linear ribs, each of which extends on a line between the front wall and the back wall.

Further objects, advantages and features of the present invention will become more fully apparent from a detailed consideration of the arrangement and construction of the constituent parts as set forth in the following description taken together with the accompanying drawing.

BRIEF DESCRIPITION OF THE DRAWINGS

In the drawing,

FIG. 1 is a front perspective view of a loudspeaker enclosure according to the invention, FIG. 2 is a perspective view, taken from beneath and from the rear, of the loudspeaker enclosure of FIG. 1, FIG. 3 is a perspective view, taken from the rear, of two speaker enclosures of FIG. 1 joined or assembled together, and FIG. 4 is a top plan view of eight loudspeaker enclosures according to FIG. 1 joined or assembled together to form a generally circular array.

DETAILED DESCRIPTION OF THE PREFERRED EMBODIMENT

Figure 1:
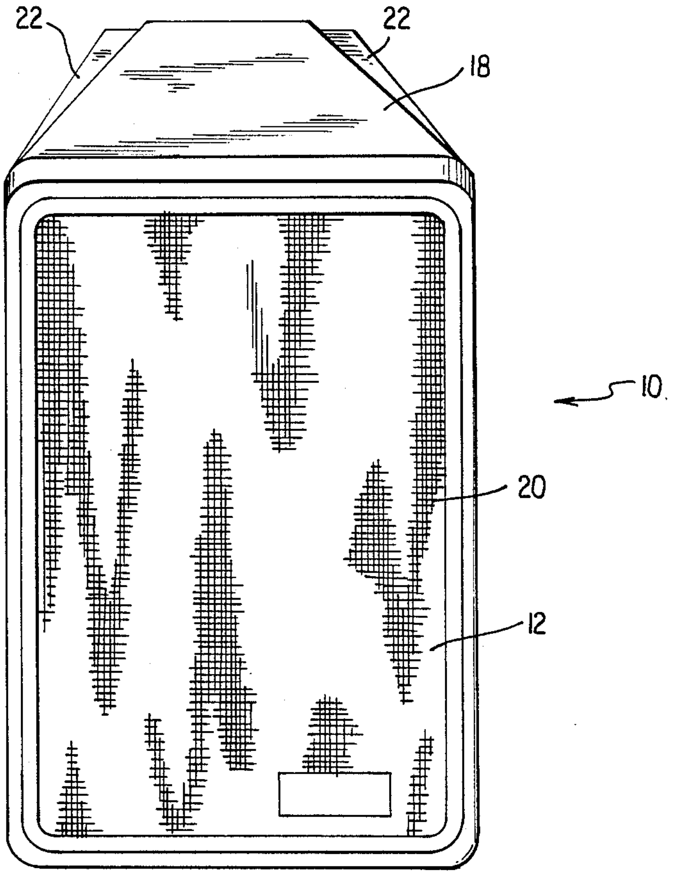
Figure 2:
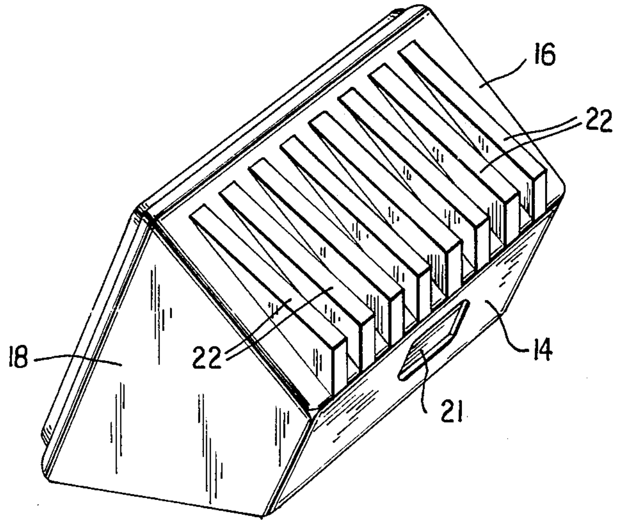

Referring first to FIGS. 1 and 2, shown is one embodiment of a loudspeaker enclosure 10 according to the present invention. Loudspeaker enclosures 10 is, as the name implies, a generally closed structure, and is adapted to contain one or more electrical loudspeakers and associated electrical circuitry (not shown). Enclosure 10 comprises front wall 12, back wall 14, two side walls 16 and two end walls 18 to form the generally closed structure in the form of a hexahedron. Front wall 12 includes a sound permeable grille 20 of a fabric, for example, such that sounds generated within enclosure 10 emanate primarily from the front wall.

The basically planar surfaces of front wall 12 and back wall 14 are generally parallel as are the two end walls 18. As is apparent, front wall 12 is of a greater width than back wall 14 and thus end walls 18 have a trapezoidal shape. Generally, side walls 16 are of equal width such that the trapezoidal end walls 18 have a regular shape.

An important feature of the invention is in the provision of a plurality of outwardly extending ribs 22 on each side wall 18 as can be seen in FIG. 2. Ribs 22 extend generally parallel to each other and, when loudspeaker enclosure is in its upright position, are oriented horizontally, i.e., the ribs extend on a line between front wall 12 and back wall 14. Ribs 22 are generally equally spaced from one another, the spacing being at least slightly larger than the thickness of the ribs. Furthermore, ribs 22 extend outwardly from side walls 18 a greater distance near back wall 14 than near front wall 12.

Figure 3:
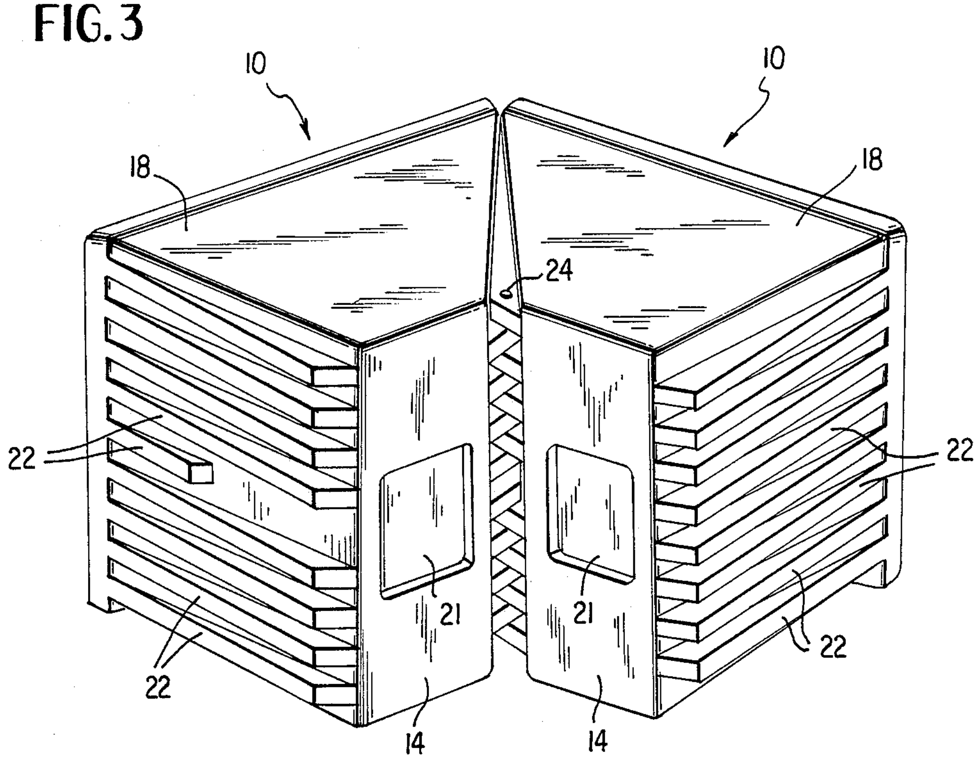

As is best shown in FIG. 3, ribs 22 of one loudspeaker enclosure can be interleaved or interdigitated with the ribs of a similar loudspeaker enclosure 10. Ribs 22 of one enclosure 10 are pivotably joined to the ribs of the other enclosures by pivot pin 24, preferably a bolt, which extends through a bore in some or all of the ribs. Thus, the orientation of one enclosure 10 to the other may be adjusted to the desired angle. Once in the proper position relative to each other, pivot pin 24 may be tightened to secure the two enclosures 10 in this orientation. If one enclosure 10 is suspended from a suitable support (not shown) by means on end wall 18 and the other enclosure is not, the interleaved ribs 22 provide a mechanical interlock and thus tend to solidly support the non-supported enclosure.

Preferably, as is illustrated in FIG. 3, ribs 22 on one side of enclosure 10 are not even with the ribs on the other side, e.g., the top rib on one side is higher than the top rib on the other side. Generally, this difference in height is the thickness of one rib 22. In a preferred embodiment, one side wall 16 contains an odd number of ribs 22 and the other has an even number of ribs. As a consequence of this construction, when two loudspeaker enclosures 10 are joined by pin 24, the top of the enclosures are level with each other.

FIG. 3 also shows that, in this embodiment, one central rib 22 of loudspeaker enclosure 10 does not extend the full width of side wall 18. This open portion 26 provides a convenient point of attachment for enclosure 10 such that it can, for example, be mounted on a speaker stand in sideways or other orientation.

Figure 4:
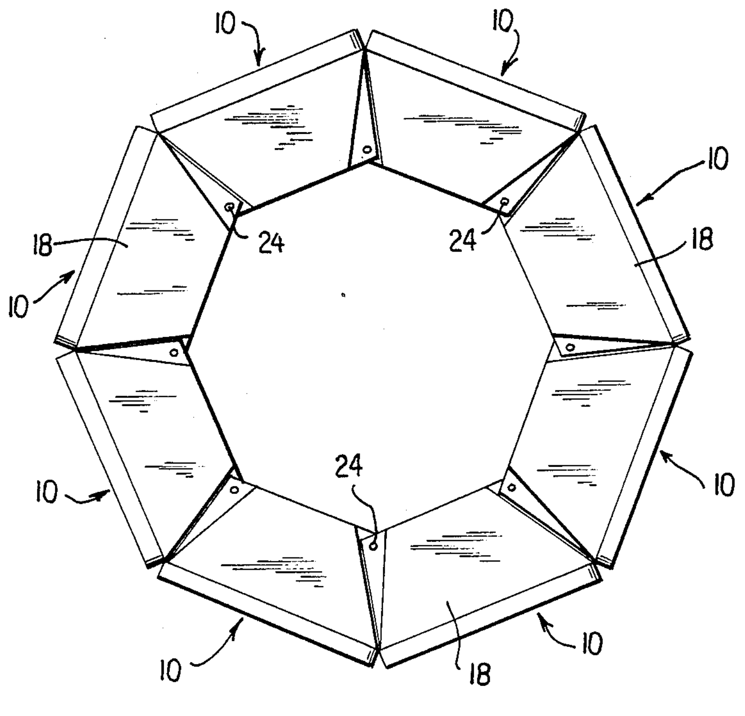

FIG. 4 illustrates how a plurality of loudspeaker enclosures 10 can be joined in circular array or cluster. It should be recognized that the number of enclosures 10 included in various arrays can vary considerably, eight being shown here for the purposes of illustration. As is apparent, a circular array of enclosures 10 as shown in FIG. 4 provides sound projection in essentially all directions. By appropriate selection of trapezoidal shape of top walls 18 of enclosure 10, arrays containing a wide number of enclosures can be assembled.

While there has been shown and described what is considered to be preferred embodiments of the present invention, it will be aparent to those skilled in the art that various changes and modifications may be made therein without departing from the invention as defined in the appended claims.

It is claimed:

1. An enclosure adapted to contain a sound generating means, the enclosure comprising a front wall through which sound can emanate, two end walls, each in the shape of a trapezoid, a back wall, and two side walls extending between the end walls and all joined together to form the enclosure, each of said side walls having a plurality of outwardly projecting linear ribs extending on a line between the front wall and the back wall, one of the two side walls having an even number of ribs and the other of said side walls having an odd number of ribs and adjacent ribs on each of said side walls defining grooves therebetween, each of said grooves is of a width to receive one of said ribs therein, spacing between the ribs being approximately equal, the ribs having a thickness approximately equal to the spacing between the ribs and a space between one of said end walls and the grooves on one side of said walls being equal to the spacing between the other of said end walls and the ribs on the other of said walls so that a pair of enclosures may be disposed in side-by-side relation with adjacent side walls thereof touching and the ribs thereof interdigitated.

2. An enclosure according to claim 1, wherein the front and back walls are essentially parallel.

3. An enclosure according to claim 1, wherein the side walls have the same dimensions.

4. An enclosure according to claim 1, wherein the ribs project outwardly from the side walls a greater distance near the back wall than near the front wall.

5. An enclosure according to claim 2, wherein the ribs project outwardly from the side walls a greater distance near the back wall than near the front wall.

6. An enclosure according to claim 1, wherein any number of ribs has a bore.

7. An enclosure according to claim 1, wherein the end walls are essentially parallel.

8. A loudspeaker system comprising the combination of a plurality of loudspeaker enclosures, each adapted to contain a sound generating means therein, each loudspeaker enclosure having a generally rectangular front wall provided with a sound permeable grille from which sounds primarily emanate, a generally rectangular back wall generally parallel to the front wall, opposite end walls extending between and joining the front and back walls, and opposite side walls extending between the front and back walls and between the opposite end walls and joining such walls to provide the loudspeaker enclosure, the back wall being of a width less than the width of the front wall so that the end walls are of trapezoidal shape and the side walls are convergent from the front wall toward the back wall, and a plurality of outstanding linear ribs projecting from one side wall of each enclosure and defining grooves therebetween, the grooves of one enclosure being of widths to receive the ribs of an adjacent enclosure in interdigitated relation and said one and said adjacent enclosures being positioned with the said end walls thereof substantially in common planes and said ribs thereof interdigitated so as to position each grille thereof in angular relation.

9. The loudspeaker system as defined in claim 8 wherein the opposite side walls of each enclosure are provided with outstanding linear ribs defining grooves therebetween so that several enclosures may be grouped in adjacent relation with ribs thereof interdigitated to project sounds from respective grilles in as many different directions as there are adjacent enclosures.

10. A loudspeaker system comprising the combination of a plurality of loudspeaker enclosures disposed in side-by-side touching relation to define an arcuate group thereof, each loudspeaker enclosure including a front wall of rectangular form from which sounds principally emanate and a back wall of rectangular form smaller than the front wall with the front walls of the arcuate group defining segments of a convex arc of the arcuate group, each enclosure also including parallel top and bottom walls of trapezoidal shape and opposite side walls of rectangular form, all of the walls being joined to defined a closed loudspeaker enclosure, adjacent side walls of the group which are in touching relation being provided with interdigitated ribs which locate the enclosures in the arcuate group thereof with bottom walls of all the enclosures of the group lying in the same plane.

11. A loudspeaker system as defined in claim 10 wherein interdigitated ribs of the system are provided with registered bores, and pivot means received in the bores for pivotally joining adjacent enclosures as the group so as to permit adjustability of the arc and consequent directions of sounds emanating from the front walls.

12. A loudspeaker system as defined in claim 11, wherein the ribs project outwardly from the side walls a greater distance near the back wall than near the front wall.

13. An enclosure as defined in claim 1 wherein the ribs are provided with registered bores adjacent the back wall, and pivot means received in the bores for pivotally joining an adjacent enclosure to said enclosure so as to permit adjustability of the directions of sound emanating from front walls of said enclosure and the adjacent enclosure.

* * * * *

UNITED STATES PATENT AND TRADEMARK OFFICE

CERTIFICATE OF CORRECTION

PATENT NO. : 4,805,730

DATED : February 21, 1989

INVENTOR(S) : Robert M. O'Neill et al.

It is certified that error appears in the above-identified patent and that said Letters Patent is hereby corrected as shown below:

In Column 2, line 38, change "18" to --16--; and
line 45, change "18" to --16--.

In Column 3, line 19, change "top" to --end--.

Signed and Sealed this

Twenty-first Day of July, 1992

*Attest:*

DOUGLAS B. COMER

*Attesting Officer*

*Acting Commissioner of Patents and Trademarks*